(12) United States Patent
Matsumura et al.

(10) Patent No.: US 11,525,866 B2
(45) Date of Patent: Dec. 13, 2022

(54) SECONDARY BATTERY MANAGEMENT DEVICE, SECONDARY BATTERY, AND SECONDARY BATTERY MANAGEMENT PROGRAM

(71) Applicant: Future Science Research Inc., Tokyo (JP)

(72) Inventors: Akihiko Matsumura, Tokyo (JP); Koji Ito, Tokyo (JP); Yuya Yoshii, Tokyo (JP); Masako Harada, Tokyo (JP)

(73) Assignee: FUTURE SCIENCE RESEARCH INC., Tokyo (JP)

( * ) Notice: Subject to any disclaimer, the term of this patent is extended or adjusted under 35 U.S.C. 154(b) by 221 days.

(21) Appl. No.: 16/913,031

(22) Filed: Jun. 26, 2020

(65) Prior Publication Data

US 2020/0326382 A1 Oct. 15, 2020

Related U.S. Application Data

(63) Continuation of application No. PCT/JP2018/048010, filed on Dec. 27, 2018.

(30) Foreign Application Priority Data

Dec. 27, 2017 (JP) .............................. JP2017-250585

(51) Int. Cl.
*G01R 31/392* (2019.01)
*G01R 31/396* (2019.01)
(Continued)

(52) U.S. Cl.
CPC ............ *G01R 31/392* (2019.01); *B60L 58/16* (2019.02); *G01R 31/371* (2019.01);
(Continued)

(58) Field of Classification Search
CPC .. G01R 31/392; G01R 31/371; G01R 31/396; B60L 58/16; H01M 10/482;
(Continued)

(56) References Cited

U.S. PATENT DOCUMENTS 8,719,195 B2 * 5/2014 Frisch .................. G01R 31/367
706/14
9,800,073 B2 * 10/2017 Katsuki ................. H02J 7/0069
(Continued)

FOREIGN PATENT DOCUMENTS

EP 3316387 A1 5/2018
JP H-10-222568 A 8/1998
(Continued)

OTHER PUBLICATIONS

Munakata Satoshi et al., "Service Parts Demand Forecasting Model with Different Failure Rate Depending on Product Usage Environment for Making Decision on Final Production Volume", Hitachi Technical Report 2010, vol. 16, non-official translation; pp. 16-21.
(Continued)

*Primary Examiner* — Tung S Lau
(74) *Attorney, Agent, or Firm* — Muncy, Geissler, Olds & Lowe, P.C.

(57) ABSTRACT

A secondary battery management device is connected with electronic equipment using a secondary battery as a driving power supply via the Internet. The secondary battery management device acquires performance information of the secondary battery from the electronic equipment, and measures a degradation level of performance of the secondary battery during a predetermined unit period. The secondary battery management device estimates a degrading speed of the secondary battery on the basis of the degradation level. The secondary battery management device may notify a user of the electronic equipment of the replacement timing of the
(Continued)

secondary battery, use fees of the secondary battery, and the like.

9 Claims, 12 Drawing Sheets

(51) Int. Cl.
    *G01R 31/371*     (2019.01)
    *B60L 58/16*     (2019.01)
    *H02J 7/00*     (2006.01)
    *H01M 10/48*     (2006.01)
    *H01M 10/42*     (2006.01)

(52) U.S. Cl.
    CPC ........ *G01R 31/396* (2019.01); *H01M 10/482* (2013.01); *H02J 7/005* (2020.01); *H01M 2010/4271* (2013.01); *H01M 2010/4278* (2013.01)

(58) Field of Classification Search
    CPC . H01M 2010/4271; H01M 2010/4278; H01M 10/4207; H01M 2220/20; H01M 10/425; H01M 10/4221; H01M 10/48; H01M 2220/30; H02J 7/005; H02J 7/00032; Y02E 60/10; Y02T 10/70; G06Q 10/04; G06Q 50/10
    See application file for complete search history.

(56) References Cited

U.S. PATENT DOCUMENTS

| | | | | |
|---|---|---|---|---|
| 10,044,212 B2* | 8/2018 | Katsuki | ................ | G01R 31/392 |
| 10,170,924 B2* | 1/2019 | Katsuki | ................ | H02J 7/0068 |
| 10,672,199 B2* | 6/2020 | Landolsi | .......... | F02M 35/10386 |
| 2010/0256935 A1 | 10/2010 | Imanishi et al. | | |
| 2012/0053871 A1 | 3/2012 | Sirard | | |
| 2013/0085696 A1 | 4/2013 | Xu et al. | | |
| 2013/0091083 A1* | 4/2013 | Frisch | .................... | G06N 20/00 |
| | | | | 706/14 |
| 2015/0196765 A1* | 7/2015 | Marnfeldt | ............ | G01R 31/392 |
| | | | | 607/2 |
| 2015/0372514 A1 | 12/2015 | Kobayashi | | |
| 2016/0335377 A1 | 11/2016 | Yamashina | | |
| 2016/0372800 A1 | 12/2016 | Kanada | | |
| 2017/0244256 A1* | 8/2017 | Katsuki | ................ | H05K 999/99 |
| 2017/0343613 A1* | 11/2017 | Frost | .................... | G01R 31/367 |
| 2018/0202398 A1* | 7/2018 | Jammoussi | .......... | F02M 35/104 |
| 2018/0358663 A1* | 12/2018 | Yonemoto | .............. | B60K 6/445 |

FOREIGN PATENT DOCUMENTS

| | | |
|---|---|---|
| JP | 2004-192999 A | 7/2004 |
| JP | 2011-240896 A | 12/2011 |
| JP | 2014-054083 A | 3/2014 |
| JP | 2014053173 A | 3/2014 |
| JP | 2015-031674 A | 2/2015 |
| JP | 2015-121520 A | 7/2015 |
| JP | 2017050126 A | 3/2017 |
| JP | 2017-112830 A | 6/2017 |
| JP | 2017111860 A | 6/2017 |
| WO | WO-2016/071941 A1 | 5/2016 |
| WO | WO-2016/208251 A1 | 12/2016 |

OTHER PUBLICATIONS

Partial Supplementary European Search Report dated Oct. 7, 2021 in EP Application No. 18894692.5, 11 pages.

* cited by examiner

FIG. 4

| BATTERY ID | EQUIPMENT ID | USER ID | DEGRADATION LEVEL(%) | | UNPAID AMOUNT(JPY) |
|---|---|---|---|---|---|
| B01 | A01 | P06 | 2 | | 200 |
| B02 | A08 | P38 | 15 | | 2500 |
| B03 | A02 | P12 | 1 | | 150 |
| B04 | A21 | P21 | 10 | ... | 1800 |
| B05 | A11 | P41 | 13 | | 1700 |
| B06 | A05 | P31 | 11 | | 1400 |
| B07 | A24 | P34 | 12 | | 1200 |
| ⋮ | ⋮ | ⋮ | ⋮ | | ⋮ |

| BATTERY ID (B01), EQUIPMENT ID (A01), USER ID (P06) | | | |
|---|---|---|---|
| PERIOD | DEGRADING BEHAVIOR F1 (T1=5) | DEGRADING BEHAVIOR F2 (T2=10) | DEGRADING BEHAVIOR F3 (T3=2) |
| 2017,11 | 4 | 3 | 0 |
| 2017,10 | ⑧ | 8 | 1 |
| 2017,9 | 0 | ⑭ | 0 |
| 2017,8 | ⑥ | 2 | 0 |
| 2017,7 | 3 | 3 | ② |
| ⋮ | ⋮ | ⋮ | ⋮ |

| EVENT | BEHAVIOR G1 | BEHAVIOR G2 | BEHAVIOR G3 | BEHAVIOR G4 |
|---|---|---|---|---|
| 1 | 0 | 0 | 0 | 1 |
| 2 | 0 | 20 | 0 | 0 |
| 3 | 8 | 4 | 0 | 0 |
| 4 | 8 | 0 | 6 | 0 |

170

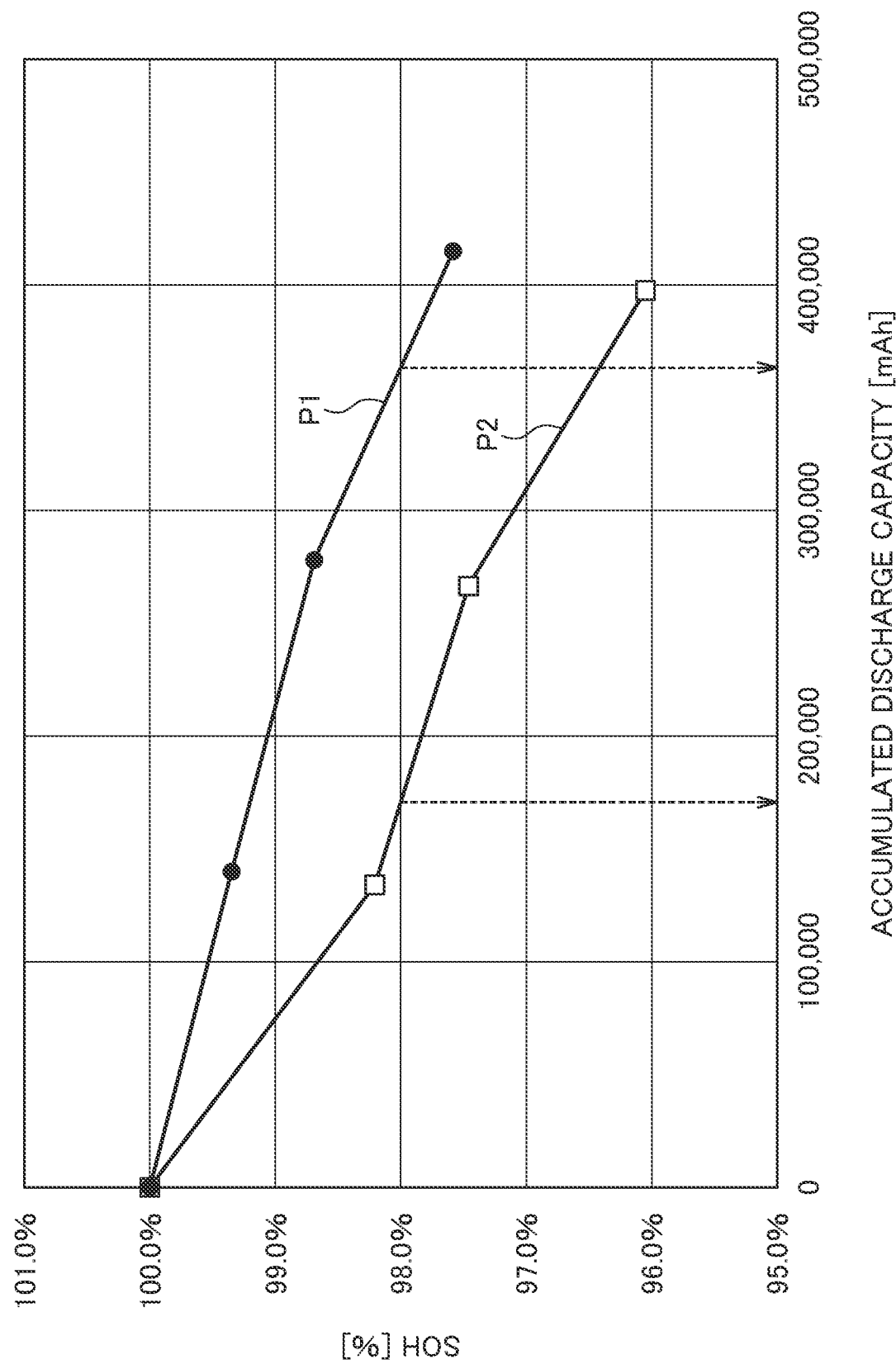

SECONDARY BATTERY MANAGEMENT DEVICE, SECONDARY BATTERY, AND SECONDARY BATTERY MANAGEMENT PROGRAM

CROSS-REFERENCE TO RELATED APPLICATIONS

This application is a continuation application of International Application No. PCT/JP2018/048010, filed on Dec. 27, 2018, which claims priority to and the benefit of Japanese Patent Application No. 2017-250585, filed on Dec. 27, 2017. The contents of these applications are incorporated herein by reference in their entirety.

BACKGROUND OF INVENTION

1. Field

The present invention relates to management of secondary batteries and, in particular, to a technology for managing usage of secondary batteries.

2. Description of Related Art

The market of secondary batteries has been steadily growing. Secondary batteries have been used in a wide range of products such as electric vehicles, mobile terminals, power-assisted bicycles, and uninterruptible power supply systems. Secondary batteries are characteristic in being usable for a long term by repeating charge and discharge. Secondary batteries vary from small-size and low-cost ones to large-size and high-cost ones depending on intended uses thereof. Typically, a user who purchased a secondary battery purchases another secondary battery at the end of the product life of the previous battery.

Patent Literature 1 describes a technology for predicting electricity demand, and adjusting power supply at charging facilities on the basis of the prediction result. Although the technology of Patent Literature 1 is aimed at vehicles, usage patterns of which are relatively easy to predict, it remains, however, unclear whether sufficient prediction accuracy is achieved.

RELATED ART LIST

Patent Literature 1: JP 2017-112830 A

The present inventors have conceived an idea that lending or transferring secondary batteries to a wide range of uses and accessing the secondary batteries or electronic equipment using the secondary batteries as necessary may enable provision of various information data on usage of secondary batteries to users. Because secondary batteries have been used in a large number of pieces of electronic equipment, collection of various measured values using the secondary batteries may enable, in addition to prediction of demands, provision of information useful to uses and developments of secondary batteries.

SUMMARY OF INVENTION

The present invention has been achieved on the basis of recognition of the aforementioned problems, and a chief object thereof is to provide a technology for providing users with information on usage of secondary batteries.

A secondary battery management device according to an aspect of the present invention is connected with electronic equipment using a secondary battery as a driving power supply via a communication network.

The device includes: a performance information acquiring unit to acquire performance information of the secondary battery from the electronic equipment; a degradation measuring unit to measure a degradation level of performance of the secondary battery during a predetermined unit period; and a degradation estimating unit to estimate a degradation level of the secondary battery at a predetermined future time point on the basis of the degradation level of the performance of the secondary battery.

A secondary battery according to an aspect of the present invention is removably mounted on electronic equipment as a driving power supply of the electronic equipment.

The secondary battery includes: a recording medium; and an equipment ID acquiring unit to acquire an equipment ID of the electronic equipment, and record the equipment ID in the recording medium.

The present invention facilitates provision of information on usage of secondary batteries to users.

BRIEF DESCRIPTION OF DRAWINGS

FIG. 4 is a data structure table of battery management information.

FIG. 7 is a data structure table of degrading behavior history information.

FIG. 9 is a data structure table of behavior aggregate information.

FIG. 12 is a graph illustrating degradation of SOH (capacity maintenance rate) as a secondary battery is used.

DESCRIPTION OF EMBODIMENTS

Hereinafter, a system in which information on secondary batteries is collected via a communication network will be described as a first embodiment, and a system in which information is saved in secondary batteries and collected at replacement or charging of the secondary batteries will be described next as a second embodiment. The first embodiment and the second embodiment will be collectively referred to as "the embodiments", or will be referred to as "the present embodiment" when the embodiments are not particularly distinguished from each other. While information is collected at replacement in the description below, information may be collected at charging. In addition, while application to secondary batteries is described in the embodiments, a similar system can be built for fuel cells.

First Embodiment

Figure 1:
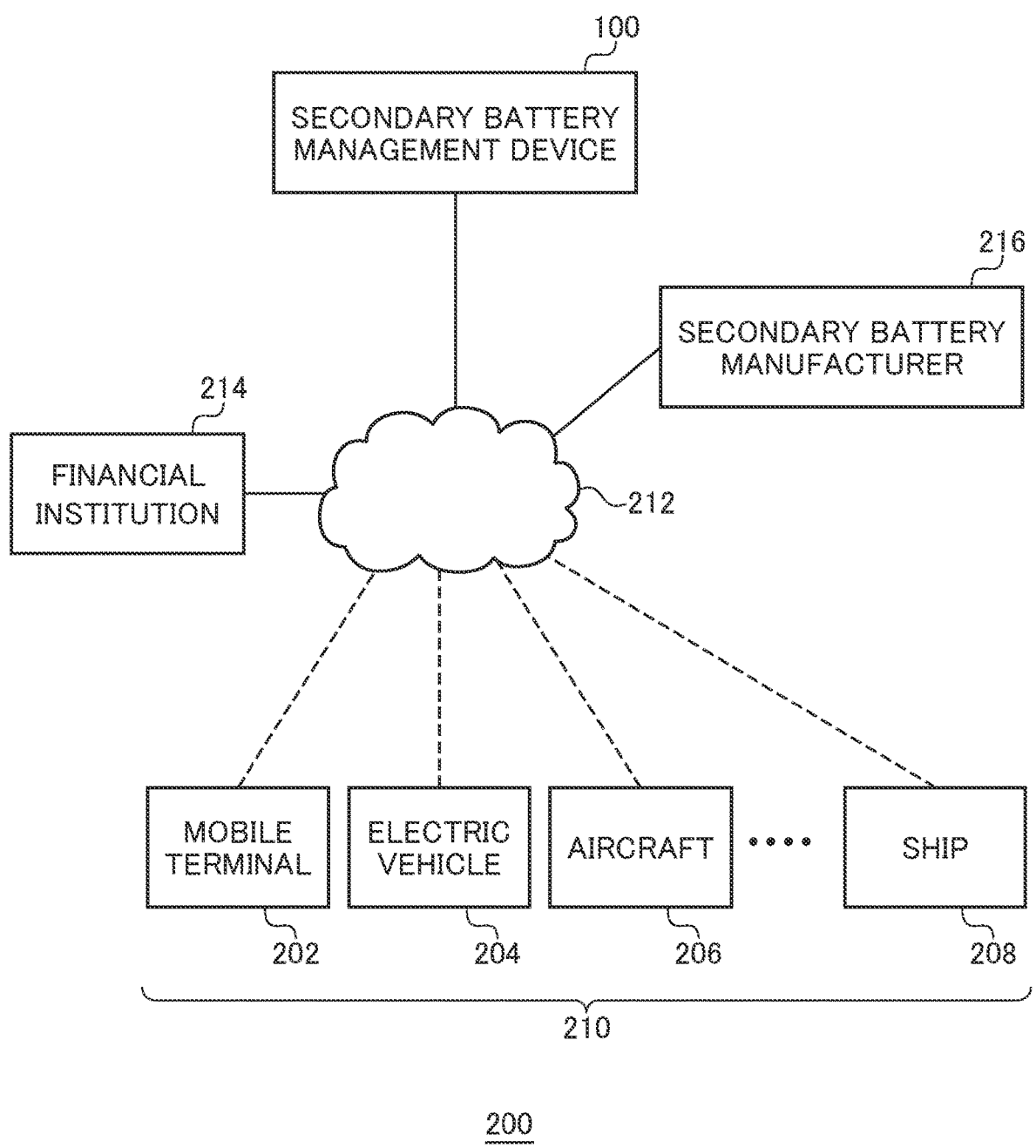
FIG. 1 is a hardware configuration diagram of a secondary battery management system.

FIG. 1 is a hardware configuration diagram of a secondary battery management system 200.

In the secondary battery management system 200, a mobile terminal 202, an electric vehicle 204, an aircraft 206, a ship 208, and the like that use secondary batteries as driving power supplies are connected with a secondary battery management device 100 via the Internet 212. Hereinafter, devices and equipment that use the secondary batteries as driving power supplies will collectively be referred to as "electronic equipment 210". Each of the secondary batteries is leased from an operator (hereinafter referred to as a "system operator") of the secondary battery management device 100. Users of the electronic equipment 210 need not purchase secondary batteries but leases the secondary batteries from the system operator and regularly pay the fees for use of the secondary batteries. In the present embodiment, the fee for use of a secondary battery is determined on the basis of the degradation level of the secondary battery (details of the degradation level will be described later).

The secondary battery management device 100 is also connected with a secondary battery manufacturer 216 that manufactures secondary batteries, and a financial institution 214 that settles payments of use fees. The secondary battery management device 100 periodically measures the degradation level each secondary battery. In the present embodiment, the degradation level is measured monthly. For example, when the secondary battery of the electric vehicle 204 has a degradation level of 5% on October 31, and a degradation level of 8% on November 30, the use fee of November is determined on the basis of a degradation level of 3% (=8-5). The secondary battery management device 100 notifies the user of the electric vehicle 204 of the use fee, and the user pays the use fee through the financial institution 214.

When the degradation level of a secondary battery becomes a predetermined value or higher, the secondary battery management device 100 notifies the user that the secondary battery is to be replaced. In this case, the secondary battery management device 100 instructs the secondary battery manufacturer 216 to deliver a new secondary battery to the user, and the secondary battery manufacturer 216 collects the used secondary battery. The secondary battery management device 100 can also manage the replacement timings of secondary batteries of the electronic equipment 210, and notify the secondary battery manufacturer 216 of a production forecast.

The secondary battery management device 100 also collects various information data from users of secondary batteries. The secondary battery management device 100 collects data indicating the usage of secondary batteries, and feeds back (provides information on) the collected data to the developers of the secondary batteries and the developers of the electronic equipment 210, details of which will be described later. Through such provision of information, the system operator cooperates towards development of secondary batteries and electronic equipment 210 using the secondary batteries.

In the description below, electronic equipment 210 is identified by an "equipment ID", the user of the electronic equipment 210 is identified by a "user ID", and a secondary battery is identified by a "battery ID".

Figure 2:
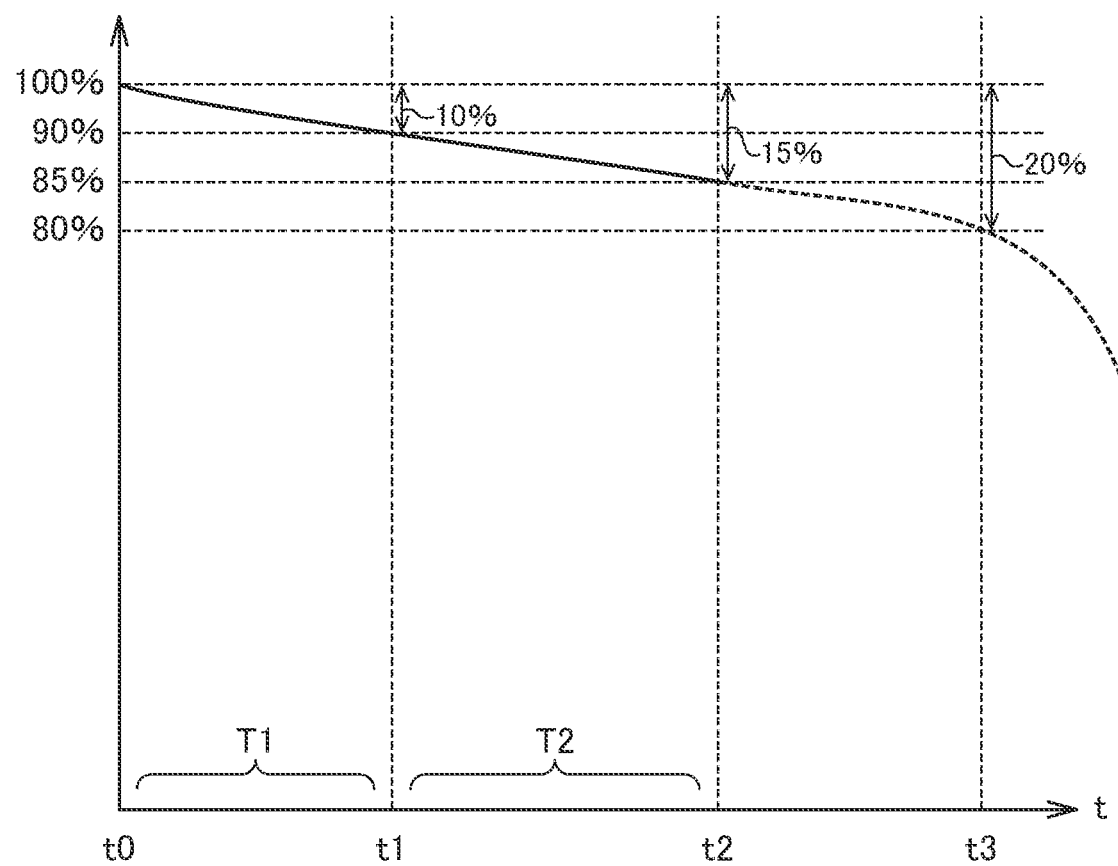
FIG. 2 is a graph schematically illustrating an aging degradation pattern of a secondary battery.

FIG. 2 is a graph schematically illustrating an aging degradation pattern of a secondary battery.

The horizontal axis represents time, and the vertical axis represents the performance of the secondary battery. The secondary battery performance is expressed by internal resistance, discharge capacity, electromotive force (voltage), current during charge and discharge, and the like as indices. Herein, the discharge capacity of a secondary battery is presented as a typical example of the "performance". Each time a secondary battery repeats charge and discharge, the discharge capacity (output) gradually decreases.

Time point t0 corresponds to the timing of the beginning of use of a secondary battery subjected to measurement. The discharge capacity at this point is an initial capacity. In the present embodiment, the degradation level is defined as degradation level (%)=100×{(initial capacity)−(measured capacity)}/(initial capacity). The measured capacity refers to the discharge capacity of the secondary battery at a measurement time point. At time point t0, the initial capacity is equal to the measured capacity, and the degradation level is thus 0(%). Assume that the secondary capacity is to be replaced when the degradation level of the secondary battery is 20(%) or higher, or in other words, when the measured capacity is 80(%) of the initial capacity. The degradation level at replacement, that is 20(%) in the example above, will be referred to as "degradation threshold".

Time point t1 is a time point a predetermined unit period after time point t0, such as one month after time point t0. At this point, the measured capacity is 90(%) of the initial capacity, and the degradation level is 10(%). Because the secondary battery has degraded by 10(%) during a unit period T1 from time point t0 to time point t1, the secondary battery management device 100 determines the use fee of the secondary battery during the unit period T1 on the basis of 10(%) that is the amount of change in the degradation level. In a case where the use fee per degradation level of 1(%) is JPY 1,000, the use fee of the secondary battery during the unit period T1 is JPY 10,000 (=1,000×10).

Time point t2 is a time point a unit period (one month) after time point t1. The degradation level at time point t2 is assumed to be 15%. Because the secondary battery has degraded by 5(%) during a unit period T2 from time point t1 to time point t2, the secondary battery management device 100 calculates the use fee of the second battery during the unit period T2 to be JPY 5,000 (=1,000×5). In this manner, the secondary battery management device 100 determines the use fee of the second battery on the basis of the amount of change in the degradation level of the secondary battery during each unit period.

In FIG. 2, assume that time point t2 is the latest measurement time point. At time point t2, the secondary battery management device 100 also estimates replacement time point t3 (future time point) of the secondary battery. The secondary battery management device 100 may estimate the replacement time point of the secondary battery to be a time point at which a line connecting the discharge capacity at time point t1 and the discharge capacity at time point t2 and the degradation threshold intersect with each other.

Figure 3:
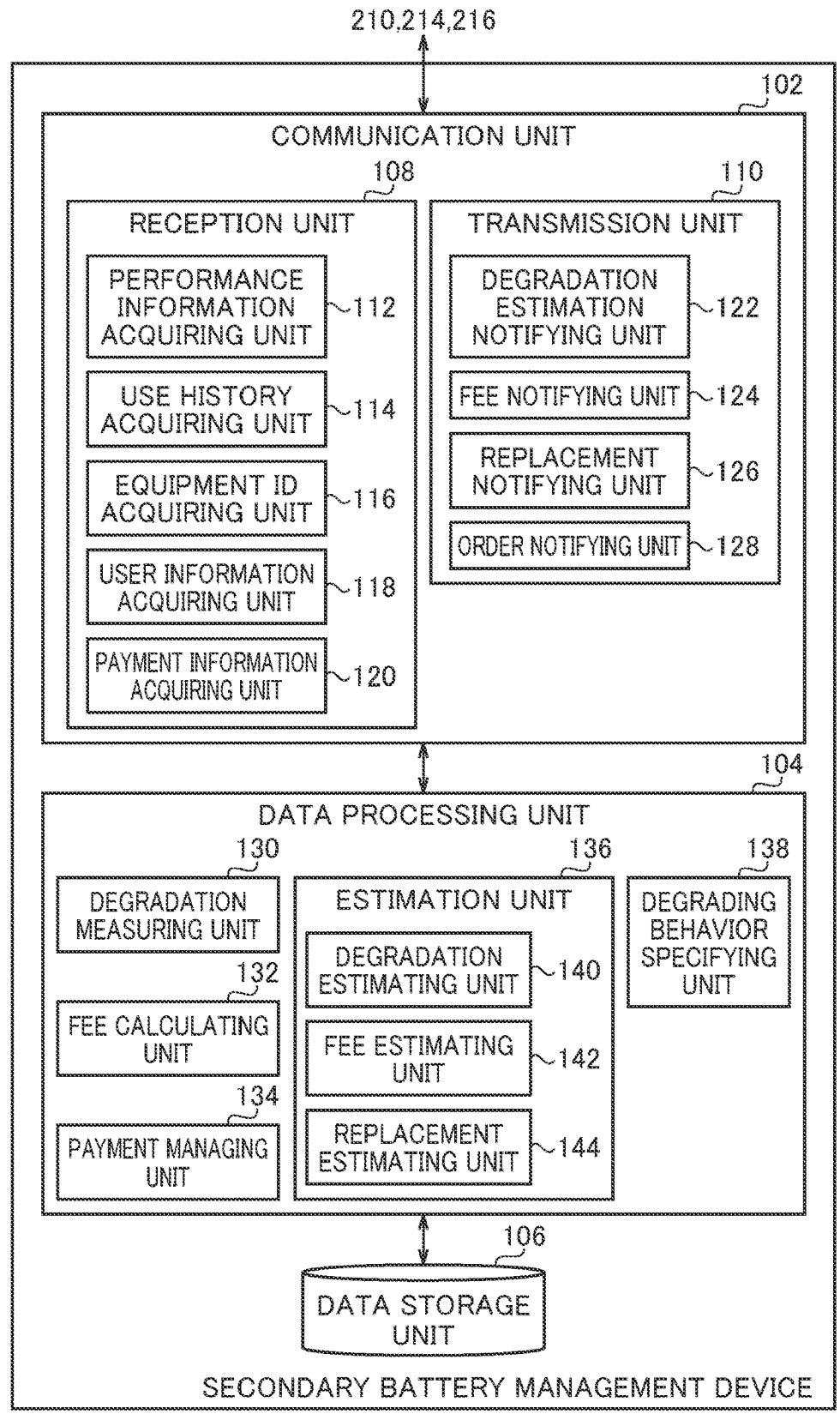
FIG. 3 is a functional block diagram of a secondary battery management device.

FIG. 3 is a functional block diagram of the secondary battery management device 100.

Respective components of the secondary battery management device 100 are implemented by hardware including arithmetic units such as central processing units (CPUs) and various coprocessors, storage devices such as memories and storages, and wire or wireless communication lines connecting the components, and software for supplying processing instructions to the arithmetic units. Computer programs may be constituted by device drivers, an Operating System, various application programs on upper layers thereof, and libraries providing common functions to the programs. Blocks described below do not represent components in hardware units but represent bocks in functional units. The same is applicable to a functional block diagram of a secondary battery 300 in a second embodiment (see FIG. 10).

The secondary battery management device 100 includes a communication unit 102, a data processing unit 104, and a data storage unit 106.

The communication unit 102 performs communication processing with the electronic equipment 210 and the like via the Internet 212. The data storage unit 106 stores various data. The data processing unit 104 performs various processes on the basis of data acquired by the communication unit 102 and data stored in the data storage unit 106. The data processing unit 104 also functions as an interface between the communication unit 102 and the data storage unit 106.

The communication unit 102 includes a reception unit 108 that acquires data from external devices, and a transmission unit 110 that transmits data to external devices. The reception unit 108 includes a performance information acquiring unit 112, a use history acquiring unit 114, an equipment ID acquiring unit 116, a user information acquiring unit 118, and a payment information acquiring unit 120.

The performance information acquiring unit 112 acquires performance information from the electronic equipment 210. The performance information refers to information indicating the performance of a secondary battery that is a driving power supply for the electronic equipment 210, such as nominal voltage, internal resistance, capacity, the number of charging times, charging rate, and the type of the secondary battery. The use history acquiring unit 114 acquires use history from the electronic equipment 210. The use history is information indicating the manner in which the user has used the electronic equipment 210. For example, in a case of a secondary battery in the electric vehicle 204, information indicating driving history such as sudden start and steep turn of the electric vehicle 204 may be acquired as the use history. In a case of a secondary battery in the mobile terminal 202, information indicating an application executed by the mobile terminal 202 may be acquired as the use history. The use history may also include information on various use states such as charge timings, the amount of charge on a single charge, and the temperature of the location of the electronic equipment 210.

The equipment ID acquiring unit 116 acquires the equipment ID of the electronic equipment 210. The user information acquiring unit 118 acquires user information from the electronic equipment 210. The user information refers to information representing the attributes of each user of the electronic equipment 210, such as the sex, the age, the place of residence, and the occupation of the user. When a user registers the user information on the electronic equipment 210, the user information acquiring unit 118 may collect the user information from the electronic equipment 210. The payment information acquiring unit 120 receives a payment completion notification from the financial institution 214.

In addition, the reception unit 108 may regularly acquire position information indicating the location of the electronic equipment 210 (secondary battery).

The transmission unit 110 includes a degradation estimation notifying unit 122, a fee notifying unit 124, a replacement notifying unit 126, and an order notifying unit 128.

The degradation estimation notifying unit 122 notifies the electronic equipment 210 of degradation estimation. The degradation estimation refers to estimation on when and how much a secondary battery being used will be degraded. The fee notifying unit 124 notifies the electronic equipment 210 of the use fee (an actual measured value and an estimated value). The replacement notifying unit 126 notifies the user of the electronic equipment 210 of whether or not the secondary battery needs replacing or a future time point at which replacement will be needed. The order notifying unit 128 instructs the secondary battery manufacturer 216 to produce and deliver a secondary battery.

The data processing unit 104 includes a degradation measuring unit 130, a fee calculating unit 132, a payment managing unit 134, an estimation unit 136, and a degrading behavior specifying unit 138.

As described with reference to FIG. 2, the degradation measuring unit 130 calculates the degradation level of a secondary battery. The fee calculating unit 132 calculates the use fee of a secondary battery. The payment managing unit 134 manages status of payments of use fees of each user on the basis of billing and payment completion notifications of the use fees of a secondary battery. The degrading behavior specifying unit 138 specifies usage that accelerates degradation of a secondary battery (hereinafter referred to as "degrading behavior").

The estimation unit 136 performs various forecasting calculations on the basis of the degradation level of a secondary battery. The estimation unit 136 includes a degradation estimating unit 140, a fee estimating unit 142, and a replacement estimating unit 144.

As described with reference to FIG. 2, the degradation estimating unit 140 estimates how the degradation of a secondary battery will evolve on the basis of degradation history of the secondary battery. The fee estimating unit 142 estimates future use fees of a secondary battery on the basis of the degradation estimation of the secondary battery. The replacement estimating unit 144 estimates replacement timing of a secondary battery.

FIG. 4 is a data structure table of battery management information 150.

The battery management information 150 is stored in the data storage unit 106. When a secondary battery is set on the electronic equipment 210, the electronic equipment 210 reads the battery ID set for the secondary battery, and transmits the battery ID together with the equipment ID and the user ID to the secondary battery management device 100. In addition, the electronic equipment 210 regularly transmits the discharge capacity (measured capacity) of the secondary battery as the performance information to the secondary battery management device 100. The degradation measuring unit 130 calculates the degradation level of each secondary battery, and registers the calculated degradation levels in the battery management information 150. The fee calculating unit 132 calculates the use fee of each secondary battery on the basis of the amount of change in the degradation level of the secondary battery during a unit period.

According to the battery management information 150 illustrated in FIG. 4, a secondary battery with a battery ID=B01 (hereinafter referred to as a "secondary battery (B01)") is used as a driving power supply for electronic equipment 210 (A01) of a user (P06). The current degradation level of the secondary battery (B01) is 2(%), and an unpaid use fee is JPY 200. The battery management information 150 provides information on a large number of secondary batteries regarding who use the secondary batteries, for what types of electronic equipment 210 the secondary batteries are used, how the secondary batteries are used, and how much use fees are charged in an integrated manner. The battery management information 150 may also include other information such as user information registered therein.

Alternatively, a secondary battery itself, instead of the electronic equipment 210, may have communication functions. The secondary battery may acquire the equipment ID, the user ID, the use history, the user information, and the like from the electronic equipment 210, and regularly transmit the performance information, the use history, the equipment ID, the battery ID, the user information, and the like to the secondary battery management device 100. Note that, for privacy protection, the user may be allowed to limit the information to be transmitted to the secondary battery management device 100 by the electronic equipment 210 or the secondary battery.

Figure 5:
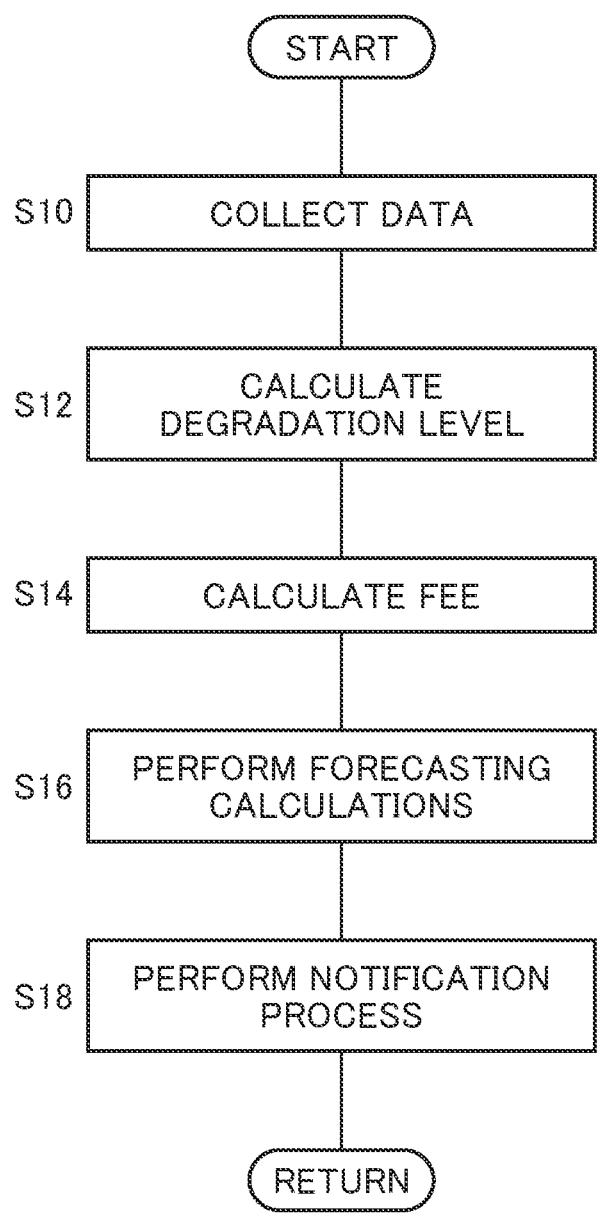
FIG. 5 is a flowchart illustrating processes for calculation of use fees.

FIG. 5 is a flowchart illustrating processes for calculation of use fees.

The processes illustrated in FIG. 5 are performed regularly at any interval such as once a week or once a day. The secondary battery management device 100 of the present embodiment is assumed to perform the processes illustrated in FIG. 5 once a month for each user. In the explanation of FIG. 5, the processes are assumed to be performed for a user P1. The secondary battery management device 100 collects various information data from the electronic equipment 210 (S10). Specifically, the performance information acquiring unit 112 acquires the performance information of the secondary battery, the use history acquiring unit 114 acquires the use history, the equipment ID acquiring unit 116 acquires the equipment ID, and the user information acquiring unit 118 acquires the user information of the user P1.

The degradation measuring unit 130 calculates the degradation level on the basis of the performance information (discharge capacity) (S12). The degradation measuring unit 130 updates the battery management information 150. Other information in the battery management information 150 is also updated on the basis of the collected information. The fee calculating unit 132 calculates the use fee of the secondary battery on the basis of the amount of change in the degradation level during one month (S14). The degradation measuring unit 130 performs various forecasting calculations on the basis of the collected data (S16). Specifically, the degradation estimating unit 140 calculates the degrading speed of the secondary battery, that is, in other words, when and how much the secondary battery will be degraded on the basis the degradation history obtained so far. The fee estimating unit 142 estimates the use fee up to a future time point on the basis of the degradation estimation. For example, in a case where the degradation level is estimated to increase by 3(%) during the next one month, the fee estimating unit 142 estimates the use fee for the next one month to be JPY 3,000 (=1,000×3). The replacement estimating unit 144 estimates the replacement timing of the secondary battery.

The transmission unit 110 provides various notifications to the user P1 (S18). The degradation estimation notifying unit 122 provides notification of the degradation estimation made by the replacement estimating unit 144, the fee notifying unit 124 notifies the use fee (billed amount) and the estimated amount of the next use fee of the secondary battery, and the replacement notifying unit 126 provides notification of whether or not the secondary battery needs to be replaced or estimated replacement timing.

The financial institution 214 withdraws the use fee from the account of the user P1, and transmits a payment completion notification to the secondary battery management device 100. Similar processes are regularly performed for every user.

Figure 6:
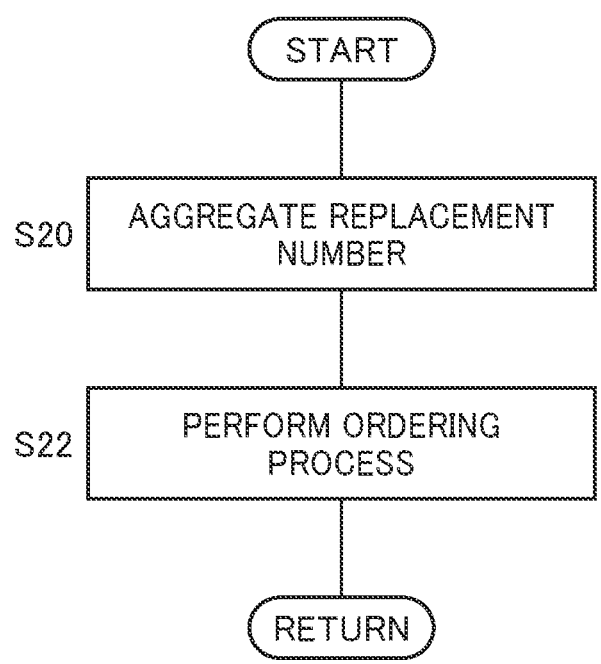
FIG. 6 is a flowchart illustrating processes for ordering secondary batteries.

FIG. 6 is a flowchart illustrating processes for ordering secondary batteries.

The secondary battery management device 100 performs the processes illustrated in FIG. 6 once a month. The secondary battery management device 100 aggregates the replacement timings of a number of secondary batteries. For example, the replacement estimating unit 144 aggregates the total number of secondary batteries that will need to be replaced during a period from two months later to three months later (S20). The order notifying unit 128 orders the estimated number of secondary batteries from the secondary battery manufacturer 216 (S22). Such a control method enables the secondary battery manufacturer 216 to minimize the secondary batteries in stock and grasp an appropriate quantity of secondary batteries to be produced.

FIG. 7 is a data structure table of degrading behavior history information 160.

The degrading behavior history information 160 is stored in the data storage unit 106. The degrading behavior history information 160 is provided for each secondary battery. In the secondary battery management device 100, a plurality of degrading behaviors F1 to F3 are defined in advance. For example, the degrading behavior F1 may be sudden start of the electric vehicle 204, the degrading behavior F2 may be fast charging, and the degrading behavior F3 may be use of a secondary battery at a site at high temperature (25° C. or higher, for example). Herein, assume that the degrading behaviors are defined by the system operator.

In FIG. 7, the numbers of times of the degrading behaviors F1 to F3 are extracted from the use history of the secondary battery (B01) used by the user (P06). The degrading behavior specifying unit 138 updates the degrading behavior history information 160 each time the use history is acquired in S10 of FIG. 5. The secondary battery (B01) is used by the electronic equipment 210 (A01) and the user (P06) (see FIG. 4). According to the degrading behavior history information 160 illustrated in FIG. 7, in November 2017, the user (P06) did the degrading behavior F1 four times, the degrading behavior F2 three times, and the degrading behavior F3 0 times on the electronic equipment 210(A01) using the secondary battery (B01) as a driving power supply.

Alert thresholds T1 to T3 are set in advance for the degrading behaviors F1 to F3, respectively. Assume the alert threshold T1=5 times, the alert threshold T2=10 times, and the alert threshold T3=2 times. When the number of times of a degrading behavior Fn per month has exceeded the alert threshold Tn, the degradation estimation notifying unit 122 notifies the user of the degrading behavior Fn. For example, when the number of times of the degrading behavior F1 per month has reached the alert threshold T1=5 times, the degradation estimation notifying unit 122 notifies the user of the possibility that the degrading behavior F1 done a number of times degraded the secondary battery (hereinafter referred to as a "degrading behavior notification"). In November 2017, because none of the number of times of the degrading behaviors exceeded the alert thresholds, no degrading behavior notification was provided.

In October 2017, the user (P06) did the degrading behavior F1 eight times. Because this exceeds the alert threshold T1=5 times, the degradation estimation notifying unit 122 notifies the user (P06) of the degrading behavior notification regarding the degrading behavior F1. The degrading behavior notification makes the user (P06) aware of the tendency of doing the degrading behavior F1. The user (P06) may have recognized that fast charging or the like is a degrading behavior, but is often unaware of what degrading behavior the user (P06) actually tends to do. The degrading behavior notification enables the user to be aware of what behavior would minimize degradation of the secondary battery, or in other words, what degrading behavior the user tends to do. Appropriate degrading behavior notification can be provided on the basis of the use history of the user, which helps the user understand how their behavior can be changed to extend the life of the secondary battery.

Figure 8:
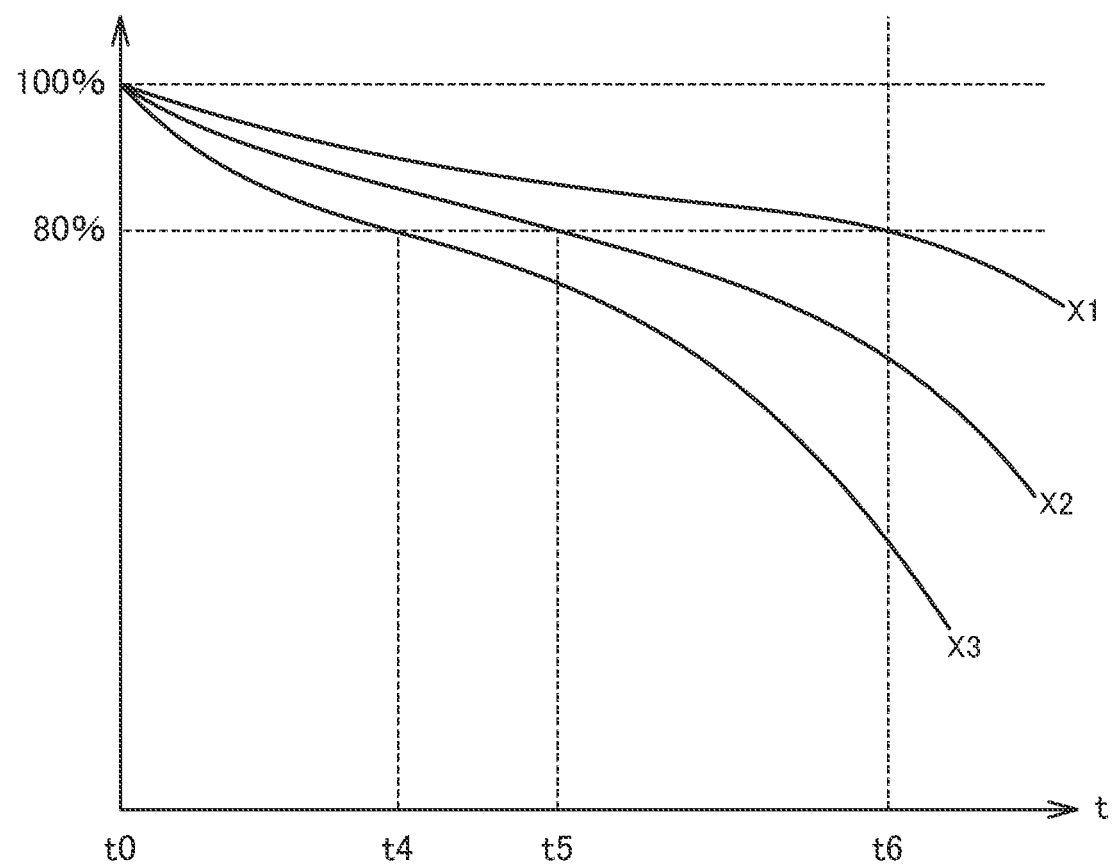
FIG. 8 is a graph schematically illustrating an aging degradation pattern of a secondary battery depending on use history.

FIG. 8 is a graph schematically illustrating an aging degradation pattern of a secondary battery depending on use history.

The progress of degradation of a secondary battery varies depending on the usage thereof. In one example, the degradation estimating unit 140 may classify users into a plurality of types depending on the frequency of degrading behaviors. For example, assume that users with the average number of times of the degrading behavior F1 described with reference to FIG. 7 per month being smaller than five times are classified as a type X1, users with the average number thereof being equal to or larger than five times and smaller than 15 times are classified as a type X2, and users with the average number thereof being equal to or larger than 15 times are classified as a type X3. A user of the type X3 is considered as being more likely to degrade the secondary battery than a user of the type X1. In the data storage unit 106, aging degradation patterns of secondary batteries associated with the types X1 to X3 are defined in advance.

Next, assume a case where degradation of a new secondary battery (B10) is estimated. Assume that the user (P55) of the secondary battery (B10) is of the type X3 according to the past use history of the user (P55). In this case, the degradation estimating unit 140 estimates the degrading speed, the use fee, the replacement timing, and the like of the secondary battery (B10) on the basis of the aging degradation pattern defined in association with the type X3. According to FIG. 8, the user (P55) is estimated to face the need to replace the secondary battery (B10) at time point t4 (one and a half months later, for example), which is relatively close to the time point t0 that is the beginning of use. Such a control method enables estimation of a future degrading speed of a secondary battery in view of the use history of the user of the secondary battery. In addition, when data indicating that many of users belonging to the type X3 have actually used the secondary battery longer than the time point t4 (one and a half months later) are obtained, the degradation estimating unit 140 may modify the aging degradation pattern (model) associated with the type X3.

The degradation may be estimated on the basis of use history other than degrading behaviors. The degrading speed of a secondary battery may vary depending on the sex, the place of residence (whether it is a warm area or a cold area), and the age of the user. For example, in a case where statistical data indicating that users living in Nagano Prefecture are significantly likely to degrade a secondary battery than users living in Gifu Prefecture are obtained, the degradation estimating unit 140 may provide different aging degradation patterns for users in Nagano Prefecture and users in Gifu Prefecture.

The degradation may be estimated on the basis of information other than use history. The degrading speed of a secondary battery can be considered as varying depending on the types of electronic equipment 210. The degradation estimating unit 140 may set a plurality of aging degradation patterns depending on the types of electronic equipment 210, and estimate the degrading speed of a secondary battery on the basis of the aging degradation pattern of the electronic equipment 210 subjected to measurement. For example, different aging degradation patterns may be applied to use of a secondary battery in a sports car and use thereof in a minivan.

The aging degradation patterns are also considered as varying depending on the types of secondary batteries. For example, the aging degradation pattern of a lithium-ion secondary battery is considered as being different from that of a sodium-sulfur battery.

FIG. 9 is a data structure table of behavior aggregate information 170.

The behavior aggregate information 170 is stored in the data storage unit 106. The behavior aggregate information 170 is used to identify degrading behaviors from use histories collected in regard to a plurality of secondary batteries and a plurality of users. While the degrading behaviors are defined and set by the system operator in FIG. 7, a method for finding out degrading behaviors from use histories (big data) of a large number of users is explained in FIG. 9.

The degrading behavior specifying unit 138 extracts use histories when the degradation level per day exceeds 5(%) from large quantities of aggregated use history data. Behaviors G1 to G4 illustrated in FIG. 9 are behaviors representing usage of the electronic equipment 210. Assume that there is an event 1 in which a behavior G4 done by a certain user only once per day degraded the performance of a secondary battery by 5(%) or higher in a day. In this case, the behavior G4 is estimated to be likely to significantly degrade the secondary battery by being done only once. The degrading behavior specifying unit 138 sets the degrading ability of 1 to the behavior G4. The "degrading ability" used herein is an index indicating how much a behavior (usage of a secondary battery) degrades a secondary battery.

In addition, assume that there is an event 2 in which a behavior G2 done by a certain user 20 times per day degraded the performance of a secondary battery by 5(%) or higher in a day. In this case, the behavior G2 is estimated to be likely to degrade the secondary battery by being done 20 times. The degrading behavior specifying unit 138 sets the degrading ability of $\frac{1}{20}$ to the behavior G2.

Assume that there is an event 3 in which the behavior G1 done by a certain user eight times per day and the behavior G2 done by the user four times per day degraded the performance of a secondary battery by 5(%) or higher in a day. Because the degradation due to the behavior G2 is ($\frac{1}{20}$)×4=$\frac{1}{5}$, $\frac{1}{5}$ of the degradation of 5(%) is attributed to the behavior G2. The degrading behavior specifying unit 138 calculates the degrading ability of the behavior G1 to be $\frac{1}{10}$ (=(1−$\frac{1}{5}$)×($\frac{1}{8}$)).

Assume that there is an event 4 in which the behavior G1 done by a certain user eight times per day and the behavior G3 done by the user six times per day degraded the performance of a secondary battery by 5(%) or higher in a day. Because the degradation due to the behavior G1 is ($\frac{1}{10}$)× 8=$\frac{4}{5}$, $\frac{4}{5}$ of the degradation of 5(%) is attributed to the behavior G1. The degrading behavior specifying unit 138 calculates the degrading ability of the behavior G3 to be $\frac{1}{30}$ (=(1$\frac{4}{5}$)×($\frac{1}{6}$)).

As described above, the degrading ability of the behavior G1 is $\frac{1}{10}$, the degrading ability of the behavior G2 is $\frac{1}{20}$, the degrading ability of the behavior G3 is $\frac{1}{30}$, and the degrading ability of the behavior G4 is 1. The degrading behavior specifying unit 138 specifies behaviors with degrading abilities of a predetermined value or larger, such as $\frac{1}{15}$ or larger, as "degrading behaviors". In the case of the example above, the degrading behavior specifying unit 138 specifies the behaviors G1 and G4 as degrading behaviors on the basis of the use histories. Collection of degradation histories and use histories in regard to a large number of secondary batteries enables the degrading behavior specifying unit 138 to reasonably detect what usage is likely to degrade a secondary battery and how much the usage is likely to degrade the secondary battery.

Second Embodiment

In the description of the first embodiment, electronic equipment 210 or secondary batteries have the communication functions, and the secondary battery management device 100 regularly accesses the electronic equipment 210, etc. to collect various data on the secondary batteries. In the second embodiment, various data on secondary batteries having storage functions are collected at replacement of the secondary batteries, instead of data collection via a communication network.

Figure 10:
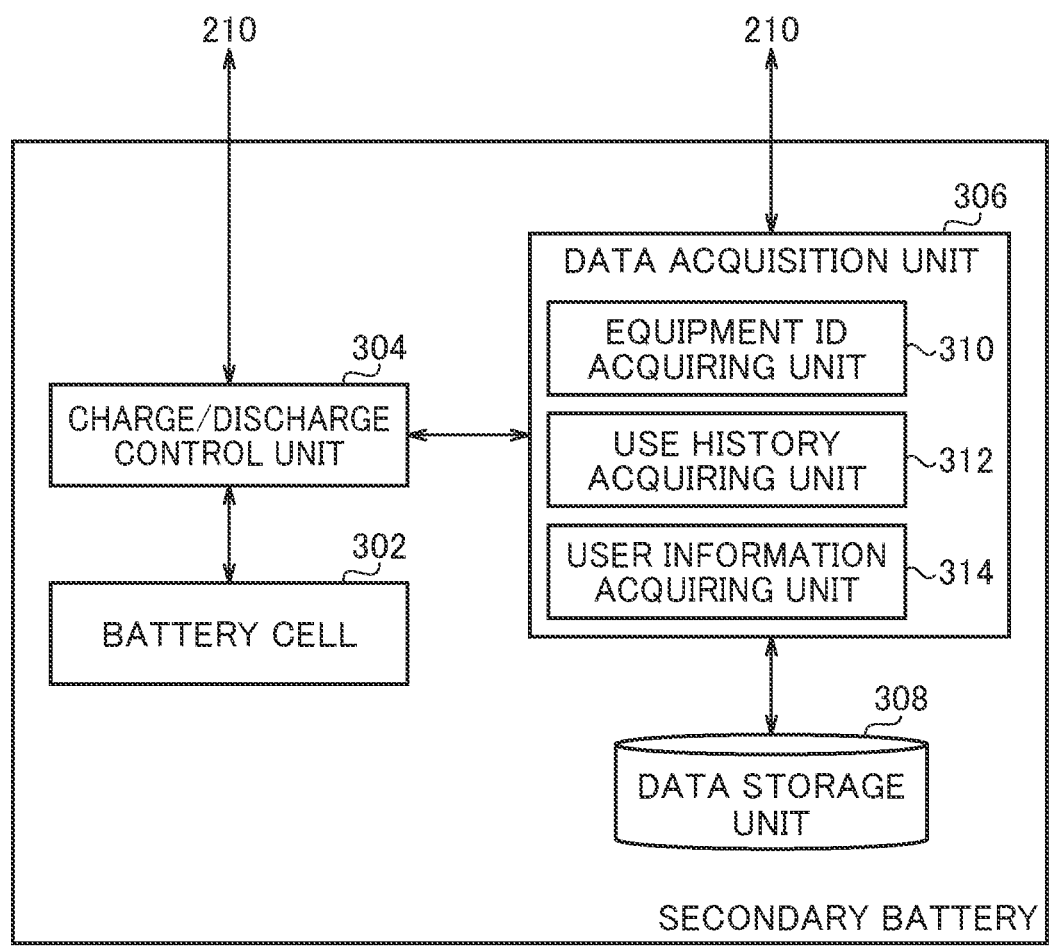
FIG. 10 is a functional block diagram of a secondary battery according to a second embodiment.

FIG. 10 is a functional block diagram of a secondary battery 300 according to the second embodiment.

The secondary battery 300 includes battery cells 302, a charge/discharge control unit 304, a data acquisition unit 306, and a data storage unit 308. The battery cells 302 are an electricity storage. The charge/discharge control unit 304 controls charge and discharge of the battery cells 302. The battery cells 302 and the charge/discharge control unit 304 are functional blocks included in known secondary batteries.

The data acquisition unit 306 acquires various data from the electronic equipment 210. The data storage unit 308 (recording medium) is constituted by a nonvolatile memory. The data acquisition unit 306 includes an equipment ID acquiring unit 310, a use history acquiring unit 312, and a user information acquiring unit 314. The equipment ID acquiring unit 310 acquires the equipment ID of the electronic equipment 210 in which the secondary battery 300 is installed. The use history acquiring unit 312 acquires the use history from the electronic equipment 210. The user information acquiring unit 314 acquires the user information from the electronic equipment 210. In the second embodiment, assume that the electronic equipment 210 associated with the secondary battery 300 includes an interface for providing various information data such as the equipment ID to the secondary battery 300.

In the second embodiment, the user replaces the secondary battery 300 at their own discretion. The system operator reads various information data such as the performance information by reading the data storage unit 308 of the collected secondary battery 300. The system operator calculates the degradation level and the use fee based on the degradation level in the same manners as in the first embodiment, and the user pays the use fee to the system operator. The use fee may be paid in one lump sum, but payment in installments reduces the burden of the cost for introduction and replacement of the secondary battery 300 on the user in a manner similar to the first embodiment.

Note that the secondary battery 300 of the second embodiment may have the functions of the degradation measuring unit 130, the fee calculating unit 132, the estimation unit 136, the degrading behavior specifying unit 138, and the like of the secondary battery management device 100. In this case, a user can check various information data such as the degradation level and the use fee as necessary even when using electronic equipment 210 that cannot be connected to the Internet 212.

The secondary battery management system 200 and the secondary battery 300 have been described above with reference to the first and second embodiments.

In the secondary battery management system 200, the user of a secondary battery need not purchase a secondary battery, which reduces the initial cost in introduction of the secondary battery (electronic equipment 210). The secondary battery management device 100 charges a use fee of a secondary battery on the basis of the degradation level the secondary battery instead of the amount of use thereof such as a discharge amount or the number of charging times. The use fee for a user who uses a secondary battery carefully becomes low, which encourages users to have an incentive to use secondary batteries carefully even though they are leased. Making users aware of such usage that extends the lives of secondary batteries is also effective in reducing environmental load.

In a system in which the use fee is determined on the basis of measurement of the number of charging times or the like of a secondary battery by a sensor in the secondary battery or electronic equipment 210, the risk of sensor failure and data falsification can hardly be avoided. Measurement of the number of charging times is also problematic in determination on how much charging rate is to be counted as one charging. In a case of a secondary battery of an electric vehicle, a method calculating the use fee on the basis of the traveling distance can be considered, but similar risk remains. In contrast, degradation of a secondary battery is a physical phenomenon, and thus enables provision of reliable information on how much the secondary battery has been used. The degradation level, which is a physical phenomenon, cannot be falsified. Even if the performance information (discharge capacity) transmitted from electronic equipment 210 to the secondary battery management device 100 while a secondary battery is being used is incorrect, the reliable degradation level can be obtained at replacement of the secondary battery, and the use fee to be finally paid will thus be a proper value. A higher fee can be charged to a user who carelessly uses a secondary battery. This eliminates the need for leasers of secondary batteries to excessively guard against the risk associated with leasing.

A secondary battery is a "device for storing electricity". It is not reasonable to determine the use fee of a secondary battery on the basis of the discharge amount or the number of charging times of the secondary battery. This is because the costs for electricity for charging secondary batteries are imposed on users. In contrast, in the present embodiment, the use fee is a price (compensation) for impairment associated with the degradation level of a leased secondary battery, that is, impairment caused by the use of such device as a secondary battery. The basis for the use fee is therefore reasonable. Because secondary batteries are devices (rented devices) whose degradation levels can be easily measured, they are suitable for building such a unique business system.

The secondary battery management device 100 is capable of notifying a user of the degrading speed, future use fees, replacement timing, and the like of a leased secondary battery. In addition, indication of what degrading behavior a user tends to do among multiple degrading behaviors contributes to improvement of the user's behavior.

The secondary battery management device 100 is also capable of analyzing what usage is likely to degrade secondary batteries by collecting use histories in regard to a large number of secondary batteries. For example, in a case where data indicating that secondary batteries are likely to be degraded by traveling on snowy roads are obtained, it can be determined that it is more rational to use gasoline engine as a power source of a hybrid car on a snowy road instead of the secondary battery. In a case where data indicating that secondary batteries of a certain type are likely to be degraded by charging using solar power are obtained, new charging/discharging circuits for reducing the loads on battery cells may be necessary. In a case where data indicating that secondary batteries mounted on electric vehicles of an automobile manufacturer M1 are less prone to degradation and that secondary batteries mounted on electric vehicles of an automobile manufacturer M2 are prone to degradation, it is advantageous for the automobile manufacturer M1 in that the data can be used in making proactive appeal to customers. In addition, the automobile manufacturer M2 recognizes the necessity for designs enabling efficient use of secondary batteries, which is considered as contributing to promotion of peripheral technologies relating to secondary batteries.

The secondary battery management system 200 is also advantageous in preventing data relating to secondary batteries from being kept only by manufacturers of electronic equipment 210. Because data on secondary batteries (general-purpose products) used in multiple electronic equipment 210 and on the electronic equipment 210 can be collected on the basis of the secondary batteries, a wealth of findings on secondary batteries and electronic equipment 210 are expected to be provided. For example, collection of geographical information on where secondary batteries have been used facilitates reasonable determination on efficient arrangement of charging stations for secondary batteries.

In the second embodiment, data such as use histories are accumulated in the secondary battery 300. In addition, the use fee depending on the degradation level is charged at replacement of the secondary battery 300. This enables a system similar to the secondary battery management system 200 of the first embodiment to be built even in a developing country with insufficient communication environment or a secluded place that is hard of access.

The present invention is not limited to the embodiments described above and modifications thereof, and any component thereof can be modified and embodied without departing from the scope of the invention. Components described in the embodiment and modifications can be combined as appropriate to form various other embodiments. Some components may be omitted from the components presented in the embodiments and modifications.

Modifications

In the description of the embodiments, various information data such as the performance information, the use history, the equipment ID, and the user information are collected for each secondary battery. A large-sized secondary battery is often constituted by an assembly of cells (small secondary batteries). In a modification, the battery ID may be assigned to each of cells instead of a secondary battery (an assembly of cells), and the performance information and the like on each cell may be collected.

For example, assume a secondary battery including 25 cells arranged in a square of 5×5. Assume that outer cells of the secondary battery turn out to be more prone to degradation than inner cells as a result of collection of various information data on the secondary battery. When such data are obtained, design of a charge control circuit for reducing loads on the outer cells is considered as being effective in extending the product life of the secondary battery. Alternatively, design of a structure of a secondary battery that facilitates replacement of outer cells relative to inner cells may be effective. In this manner, collection of information on each cell may also enable a wealth of findings on the design of secondary batteries to be provided.

In the embodiments, the degree to which the discharge capacity is lowered is defined as a degradation level. The degradation level can also be defined with data other than discharge capacity. The internal resistance of a secondary battery is known to increase each time the secondary battery repeats charge and discharge. The secondary battery management device 100 may define the degradation level (%) as {(measured resistance)−(initial resistance)}/(initial resistance). Alternatively, the degradation level may be defined on the basis of both a degradation level A calculated on the basis of the discharge capacity and a degradation level B calculated on the basis of the internal voltage, as an average of the degradation level A and the degradation level B, for example.

Alternatively, the degradation level may be defined on the basis of the degree to which the battery capacity is lowered with time, or the degree to which the mileage on a full charge of an electric vehicle 204 is lowered. Alternatively, the degradation level may be defined on the basis of an open-circuit voltage (OCV), an open-end voltage, or the like instead of the discharge capacity.

The secondary battery management device 100 may hold aging degradation patterns (models) of secondary batteries, and estimate degradation on the basis of the aging degradation patterns. Such models may be formed as neural network models. The use histories and the like of secondary batteries that are degraded relatively rapidly may be analyzed, various parameters such as behaviors, the types of electronic equipment 210, and use environment (such as temperature) may be set in input layers, and how much these parameters affect the degradation of the secondary batteries may be analyzed. The degradation of each secondary battery may then be estimated on the basis of the neural network models. Degrading behaviors may be specified on the basis of weighting factors set for respective models of input layers (parameters). Accumulation of data on secondary batteries elaborates the models.

In the description of the embodiments, the replacement notifying unit 126 provides notification of the replacement timing of a secondary battery. The secondary battery management device 100 may include a charging position notifying unit for providing notification of the positions of charging stations for secondary batteries. The secondary battery management device 100 may also include a charging timing notifying unit for notifying the electronic equipment 210 of the timing for charging. The use history acquiring unit 114 of the secondary battery management device 100 may further regularly acquire charging rate information on each secondary battery. The charging timing notifying unit may transmit a notification for prompting a user to charge the secondary battery to electronic equipment 210 using the secondary battery when the charging rate of the secondary battery is a predetermined threshold, such as 30%, or lower.

In the description of the first embodiment, information on secondary batteries is regularly collected. Alternatively, information may be collected when secondary batteries are charged. For example, because an electric vehicle 204 needs to be stopped for charging of the secondary battery, information on the secondary battery is readily collected from the electric vehicle 204 during charging.

In the description of the second embodiment, information is collected at replacement of secondary batteries. In the second embodiment as well, information may be collected at charging of secondary batteries. For example, when charging stations have communication functions, the charging stations may read various information data from the data storage unit 308 of the secondary battery 300 and transmit the information to the secondary battery management device 100.

Secondary batteries that have exceeded a degradation threshold may be subjected to secondary use. For example, secondary batteries with degradation levels exceeding 20% (hereinafter referred to as "degraded secondary battery") may be reused by an operator of an energy storage system (ESS). For example, assume that the degradation level of secondary battery used by a user A has exceeded the degradation threshold. In this case, the replacement notifying unit 126 of the secondary battery management device 100 notifies the user A that the degraded secondary battery is to be replaced, and notifies a user B who operates an ESS that a degraded secondary battery has come out. The secondary battery management device 100 may include a matching unit that matches the user A with the user B. The matching unit intermediates between the user A and the user B to form a consensus on the price and the time for picking up the degraded secondary battery. After the consensus is formed, the system operator of the secondary battery management device 100 sends the degraded secondary battery collected from the user A to the user B.

In addition, when the degradation level of the degraded secondary battery has exceeded a predetermined threshold, such as 50%, the degraded secondary battery may be broken down to be recycled. The replacement notifying unit 126 may notify the user B that the degraded secondary battery is to be recycled when the degradation level of the degraded secondary battery used by the user B has exceeded 50%.

The cost for introducing a secondary battery does not have to be zero. For example, half the price of a secondary battery may be initially charged and the remaining amount may be included in use fees.

In the embodiments, the method for finding out behaviors that degrade secondary batteries from use histories has been explained. Alternatively, behaviors for avoiding degradation of secondary batteries may be extracted. For example, when a user P2 who degrades the secondary battery little even though the user P2 frequently charges the secondary battery, the behaviors of the user P2 may be investigated. After such investigation, the know-how of the user P2 for extending the life of a secondary battery may be presented to other users.

It is also possible to estimate electric power generation on the basis of the degradation levels of a large number of secondary batteries. For example, a secondary battery with a high degradation level has a small power storage. Thus, when the number of relatively degraded secondary batteries is large, the necessary amount of power generation is expected to be small. In contrast, when the number of new or replaced secondary batteries, or in other words, relatively less degraded secondary batteries is large, the necessary amount of power generation is expected to be large. The secondary battery management device 100 may estimate not only the use fees but also necessary power amounts on the basis of the degradation levels of secondary batteries, and notify a power producer of the estimation.

In the embodiments, degradation of secondary batteries has been described. The present invention is, however, also applicable to batteries, other than secondary batteries, that are degraded. For example, outputs of fuel cells also lower as the fuel cells are used. Thus, the degradation levels of fuel cells may also be measured, and collection of various information data thereon such as use histories, calculation of use fees, and the like may be performed. A "secondary battery" used herein includes a "fuel cell" in a broad sense.

Figure 11:
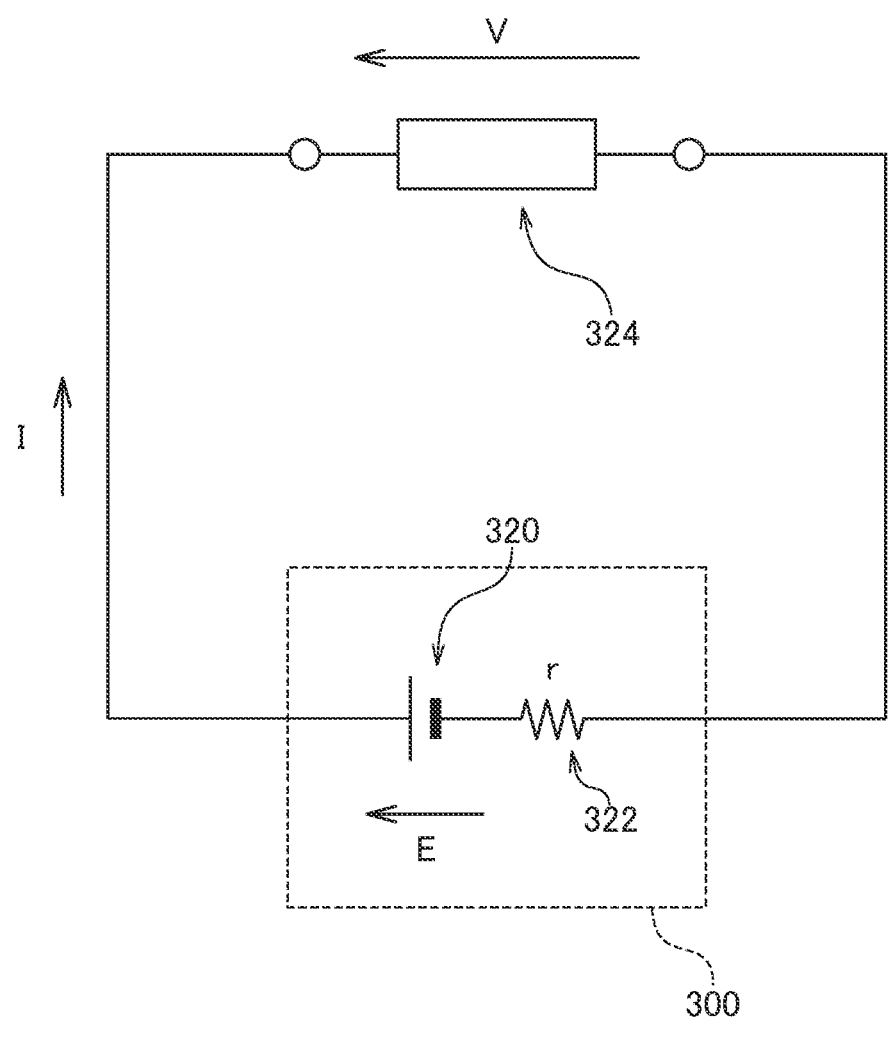
FIG. 11 is a circuit diagram of a measurement circuit that measures discharge capacity of a secondary battery.

FIG. 11 is a circuit diagram of a measurement circuit 330 that measures discharge capacity of a secondary battery 300.

The secondary battery 300 includes a battery component 320 and a resistor component 322. When charge and discharge are repeated, a layer is gradually formed on an anode surface by reaction between graphite used as an anode material of the secondary battery 300 and an electrolyte. The resistor component 322 (internal resistance r) is caused by the layer on the anode. When the internal resistance r=0, the electromotive force E of the battery component 320 and the voltage V applied to an external resistor 324 are equal to each other. When the internal resistance r is not zero, however, $V=E-I\cdot r$, where I represents discharge current, is satisfied, and the discharge voltage is lowered by the resistor component 322. Thus, the degradation level of the secondary battery 300 can thus be expressed by measuring the difference between the OCV (open-end voltage) and discharge voltage as an index.

Typically, the degradation level of the secondary battery 300 is expressed by States Of Health (SOH) as an index. The SOH represents a capacity maintenance rate, but may also be defined as the resistance increase rate of the internal resistance r. In the description below, the SOH is assumed to be the capacity maintenance rate. The SOH is determined by a discharge capacity value; the SOH is, however, also affected by the current value and the temperature during measurement, and is thus evaluated in view of these values. Note that the capacity of the secondary battery 300 refers to the electric (charge) quantity that can be taken out from the secondary battery 300 in a fully charged state when the secondary battery 300 is discharged until the terminal voltage of the external resistor 324 reaches a predetermined cut-off voltage.

FIG. 12 is a graph illustrating degradation of the SOH (capacity maintenance rate) as the secondary battery 300 is used.

The present inventors conducted experiments on the degrading speed of the secondary battery 300 associated with charge and discharge thereof. In the experiments, a cylindrical cell of a lithium-ion secondary battery (secondary battery 300) having a size of 18 mm×65 mm was used. The initial capacity of the secondary battery 300 was 2,750 (mAh). The temperature during measurement was 25 degrees Celsius. Charge and discharge of the secondary battery 300 were repeated, and the decrease (degradation) in the SOH with accumulated discharge capacity (mAh) was measured.

Charge was deemed to be completed when the voltage reached 4.2 (V), and discharge was deemed to be completed when the voltage reached 2.5 (V). The SOH was periodically measured while charge and discharge were repeated.

A degradation curve P1 represents the tendency of the decrease in the SOH under a condition 1 based on safe driving of the electric vehicle 204. A degradation curve P2 represents the tendency of the decrease in the SOH under a condition 2 based on driving with quick acceleration of the electric vehicle 204. Under the condition 1, the capacity rate (C-rate) of charging was 0.2, the C-rate of discharging was also 0.2. The C-rate of charging or discharging the secondary battery 300 of 2,750 (mAh) in one hour was defined as 1.0. The C-rate of 0.2 means that charging is relatively slow. Under the condition 2, the C-rate of charging was 0.2, and the C-rate of discharging was 0.8. Under the condition 2, the discharge current was made larger than that in the condition 1 to rapidly discharge the secondary battery 300. Note that the charge currents and the discharge currents of the degradation curve P1 and the degradation curve P2 were constant currents.

The experiments show that the secondary battery 300 is degraded faster when the secondary battery 300 is rapidly discharged (degradation curve P2: condition 2) than when the secondary battery 300 is not rapidly discharged (degradation curve P1: condition 1).

A user A1 is assumed to drive the electric vehicle 204 safely. In the case of safe driving, the secondary battery 300 is estimated to be degraded by about 2(%) when the accumulated discharge capacity reaches about 360,000 (mAh). In contrast, a user A2 is assumed to perform driving with quick acceleration of the electric vehicle 204. In the case of driving with quick acceleration operation, the secondary battery 300 is estimated to be degraded by about 2(%) when the accumulated discharge capacity reaches about 170,000 (mAh). Even though the user A1 uses more electrical energy than the user A2, the user A1 uses the secondary battery 300 more carefully than the user A2, and is thus charged as much use fees as the user A2. Such a system provides an inventive for users to use secondary batteries 300 carefully.

Manufacture of secondary batteries 300 involves a significant cost. If many users can be led to use secondary batteries 300 with care, the resources and labor for manufacture of secondary batteries 300 in the world as a whole can be effectively reduced.

In the first embodiment, special application software for measuring voltage, current, and temperature (hereinafter referred to as "performance measurement software") may be introduced to electronic equipment 210 such as the electric vehicle 204. In the second embodiment, performance measurement software may be introduced to the secondary battery 300. The performance measurement software regularly measures performance information such as the discharge capacity, and notifies the secondary battery management device 100 of the performance information. The performance measurement software only needs to have measurement functions and communication functions. The secondary battery management device 100 calculates the degradation level on the basis of the performance information acquired from the performance measurement software, and calculates the use fee of the secondary battery 300. The performance measurement software may calculate the degradation level on the basis of the performance information and notify the secondary battery manufacturer 216 of the degradation level.

Even if a malicious user falsifies or invalidates the performance measurement software, the user has to replace the secondary battery 300 at some time point. Because the degradation level of the secondary battery 300 can be measured at the replacement point, adjustment of payment at the replacement cannot be avoided even if the degradation level has been fudged during use of the secondary battery 300. In the case of the electric vehicle 204, charging stations may acquire the performance information of the secondary battery 300 when the secondary battery 300 is charted at the charging stations. The charging stations may then transmit the performance information to the secondary battery management device 100. Alternatively, measurers may regularly acquire the performance information of individual secondary batteries 300.

The secondary battery management device 100 of the embodiments collects performance information from a large number of secondary batteries 300. For example, in a case where 50 million secondary batteries 300 of a type T1 have been distributed, such estimation as four million of them being expected to be replaced next month makes production scheduling easier for the secondary battery manufacturer 216. Estimation of replacement timings of a large quantity of secondary batteries 300 in an integrated manner by the secondary battery management device 100 facilitates prevention of a dead stock of secondary batteries 300 due to overproduction or loss of business opportunities due to underproduction.

As described above, the estimation of degradation of the secondary battery 300 may be based on an aging degradation table. For example, assume a case where actual performance information as follows is obtained: when the secondary battery 300 is degraded by 5(%) in one month from replacement, the probability that the degradation level of the secondary battery 300 will reach 20(%) in two months from replacement is 3(%), the probability that the degradation level of the secondary battery 300 reaches 20(%) in three month from replacement is 15(%) . . . . In this case, an aging degradation table may be set on the basis of the actual performance information. When such an aging degradation table based on actual performance information is provided, future evolution of the degradation of a secondary battery 300 can be estimated by referring to the actual degrading speed and the aging degradation table of the secondary battery 300.

In the first embodiment, special application software for measuring usage of electronic equipment 210 (hereinafter referred to as "usage measurement software") may be introduced to the electronic equipment 210. In the second embodiment, usage measurement software may be introduced to the secondary battery 300. The usage measurement software acquires usage information of the electronic equipment 210, and notifies the secondary battery management device 100 of the usage information. For example, assume that the secondary battery 300 is mounted on mobile equipment such as the electric vehicle 204. In this case, the usage measurement software acquires the number of sudden starts, the number of sudden stops, the average speed, and the highest speed per unit time of the mobile equipment, the percentage of time during which the mobile equipment traveled at speeds higher than a threshold in the traveling time thereof, and the like as usage information. The usage measurement software may also notify the secondary battery management device 100 of a so-called eco-driving score (known technology) as usage information. The secondary battery management device 100 may estimate the degradation level of the secondary battery 300 on the basis of results in notification from the usage measurement software. For example, a plurality of aging degradation tables depending on eco-driving scores may be provided in advance. Upon receiving a score from an electric vehicle 204 to be measure, the degradation estimating unit may estimate future evolution of the degradation of the secondary battery 300 on the basis of an associated aging degradation table.

A plurality of aging degradation tables may be provided depending on the types of secondary batteries 300. Alternatively, a plurality of aging degradation tables may be provided depending on the types of electronic equipment 210 on which secondary batteries 300 are mounted. A plurality of aging degradation tables may be provided depending on the attributes of users. The degradation estimating unit 140 may estimate the degradation of a secondary battery 300 on the basis of the type of the user, the type of electronic equipment 210, and the type of secondary battery 300.

The degradation measuring unit 130 may calculate the degradation level on the basis of a plurality of kinds of performance information. For example, the degradation measuring unit 130 may calculate the degradation level on the basis of each of the amount of change in the internal resistance and the amount of change in the capacity maintenance rate. The degradation measuring unit 130 may determine the highest, the lowest, the average or the median of a plurality of kinds of degradation levels as a final degradation level of the secondary battery 300. Comprehensive determination of the degradation level of a secondary battery 300 from degradation levels obtained from a plurality of aspects in this manner enables more reasonable calculation of the degradation level.

Permissible values of the degradation level of a secondary battery 300 (degradation thresholds) are considered as varying depending on users of the secondary battery 300. For example, a user A4 is assumed to use a secondary battery 300 with a degradation level of 90 to 100(%), and replaces the secondary battery 300 when the degradation level becomes lower than 90(%). A user A5 is assumed to use a secondary battery 300 with a degradation level of 70 to 100(%). In this case, the secondary battery 300 with a degradation level lower than 90(%) that can no longer be used by the user A4 is usable for the user A5. The aforementioned matching unit may notify the user A5 that the secondary battery 300 of the user A4 is available at the replacement timing of the secondary battery 300 of the user A4 or at a timing when the replacement thereof is expected. Alternatively, the matching unit may deliver the secondary battery 300 that is no longer used by the user A4 to the user A5. When the user A4 replaces the secondary battery 300, the matching unit may search for a user who can use this secondary battery 300, and inform the user that the secondary battery 300 is available.

When no user who can use the secondary battery 300 that is no longer used by the user A4 is present, the replacement notifying unit 126 may deliver the secondary battery 300 to a recycler.

The use fees of a secondary battery 300 may be determined on the basis of a purchase price of the secondary battery 300 and a degradation threshold set as a measure of replacement. For example, assume that a purchase price of a secondary battery 300 is JPY 100,000, and that the secondary battery 300 is to be replaced when the degradation level reaches a degradation threshold of 20(%). In this case, because a degradation level of 20(%) is assumed to amount to a value of JPY 100,000, the use fee per a degradation level of 1(%) may be JPY 5,000 (=100,000÷20). In this manner, the fee calculating unit 132 may calculate a use fee associated with a degradation level on the basis of the purchase price of a secondary battery 300 and a degradation threshold set by the user or the manufacturer of the secondary battery 300. Such a control method enables reasonable calculation of use fees of various types of secondary batteries 300 in the secondary battery management system 200, which encourages users to participate in the lease system provided by the secondary battery management system 200 at ease.

In addition, the secondary battery management device 100 can calculate use fees of a variety of secondary batteries 300 in a simple and fair manner on the basis of the purchase prices (selling prices) and degradation thresholds, and is thus applicable to management of various types of secondary batteries 300. Use fees of secondary batteries 300 with high purchase prices are high, and use fees of secondary batteries 300 that are less prone to degradation are low.

In the description of the embodiments, users of secondary batteries 300 are charged use fees depending on the degradation levels. In some cases, a government can impose a tax on users of secondary batteries 300 depending on the degradation levels. This encourages the public to make a conscious effort to use secondary batteries 300 carefully for a longer time, which contributes to effective use of precious resources. In addition, users who drive safely get preferential treatment in terms of fees as compared with users who perform driving with quick acceleration, which can be expected to produce an effect of improving drivers' compliance with safety rules in driving electric vehicles 204.

Payments of use fees (costs) in small amounts based on the degradation levels of secondary batteries 300 correspond to depreciation of purchase prices of fixed assets in financial statements. The secondary battery management system 200 may also make it easier for companies to introduce secondary batteries 300 in terms of accounting.

The following invention can be derived from the embodiments and modifications.

A1. A secondary battery management device connected with electronic equipment via a communication network, the electronic equipment using a secondary battery as a driving power supply, the secondary battery management device comprising:

a performance information acquiring unit to acquire performance information of the secondary battery from the electronic equipment;

a degradation measuring unit to measure a degradation level of performance of the secondary battery during a predetermined unit period; and a fee calculating unit to calculate a use fee of the secondary battery for the unit period depending on the degradation level.

A2. The secondary battery management device according to A1, further comprising:

a degradation estimating unit to estimate a degradation level of the secondary battery at a predetermined future time point on the basis of the degradation level of the performance per unit period of the secondary battery.

A3. The secondary battery management device according to A2, further comprising:

a fee estimating unit to estimate a use fee of the secondary battery for a predetermined unit period on the basis of the estimation of the degradation level of the secondary battery; and a fee notifying unit to notify a user of the electronic equipment of the estimated use fee.

A4. The secondary battery management device according to A2 or A3, further comprising:

a replacement estimating unit to estimate replacement timing of the secondary battery on the basis of the estimation of the degradation level of the secondary battery; and a replacement notifying unit to notify a user of the electronic equipment of the estimated replacement timing.

A5. The secondary battery management device according to any one of A1 to A4, further comprising:

a use history acquiring unit to acquire use history of the electronic equipment from the electronic equipment; and a degrading behavior specifying unit to refer to degradation history of the secondary battery and the use history, and specify a degrading behavior performed by a user of the electronic equipment from among a plurality of degrading behaviors defined as usage that degrades the secondary battery.

A6. The secondary battery management device according to A1, wherein the performance information acquiring unit acquires, as the performance information, a discharge capacity of the secondary battery, and the degradation measuring unit measures, as the degradation level, a decrease in the discharge capacity during the unit period.

A7. The secondary battery management device according to any one of A1 to A6, wherein the fee calculating unit calculates the use fee depending on a type of the secondary battery on the basis of both a purchase price and a degradation threshold of the secondary battery.

A8. A secondary battery management program causing a computer to implement:
 a function of acquiring performance information of a secondary battery from electronic equipment using the secondary battery as a driving power supply;
 a function of measuring a degradation level of performance of the secondary battery during a predetermined unit period; and
 a function of calculating a use fee of the secondary battery for the unit period depending on the degradation level.

What is claimed is:

1. A secondary battery management device connected with electronic equipment via a communication network, the electronic equipment using a secondary battery as a driving power supply, the secondary battery management device comprising:
 a performance information acquiring unit to acquire performance information of the secondary battery from the electronic equipment;
 a degradation measuring unit to measure a degradation level of performance of the secondary battery during a predetermined unit period;
 a degradation estimating unit to estimate a degradation level of the secondary battery at a predetermined future time point; and
 a use history acquiring unit to acquire use history from a plurality of pieces of electronic equipment, the use history being information indicating usage of each of the pieces of electronic equipment used by users, wherein
 the degradation estimating unit refers to the degradation level of the performance and the use history of each of a plurality of secondary batteries, and estimates a degradation level of a secondary battery used by a first electronic equipment at a predetermined future time point on the basis of use history of the first electronic equipment.

2. The secondary battery management device according to claim 1, further comprising:
 a degrading behavior specifying unit to refer to a degradation level of performance and use history of each of the secondary batteries, and specify a degrading behavior being usage of the electronic equipment when the degradation level per unit time of the secondary battery is a predetermined value or higher.

3. The secondary battery management device according to claim 1, further comprising:
 an equipment ID acquiring unit to acquire an equipment ID identifying a piece of electronic equipment among a plurality of pieces of electronic equipment, wherein
 the degradation estimating unit refers to the degradation level of performance and an equipment ID associated with each of the plurality of secondary batteries, and estimates a degradation level of a secondary battery used by second electronic equipment at a predetermined future time point on the basis of the equipment ID of the second electronic equipment.

4. The secondary battery management device according to claim 1, wherein
 the performance information acquiring unit acquires performance information of each of a plurality of cells constituting the secondary battery,
 the degradation measuring unit measures a degradation level of performance of each of the cells, and
 the degradation estimating unit estimates a degradation level of each of the cells.

5. The secondary battery management device according to claim 1, further comprising:
 a user information acquiring unit to acquire user information of each of users of a plurality of pieces of electronic equipment from the pieces of electronic equipment, wherein
 the degradation estimating unit refers to a degradation level and user information of each of the plurality of secondary batteries, and estimates a degradation level of a secondary battery used by third electronic equipment at a predetermined future time point on the basis of user information of the third electronic equipment.

6. The secondary battery management device according to claim 1, further comprising:
 a replacement estimating unit to estimate replacement timing of a secondary battery of each of the pieces of electronic equipment on the basis of estimation of degradation levels of the secondary batteries; and
 a replacement notifying unit to notify an external device of the number of secondary batteries to be replaced at a predetermined future time point among a plurality of pieces of electronic equipment.

7. The secondary battery management device according to claim 1, wherein
 the performance information acquiring unit acquires, as the performance information, a discharge capacity of the secondary battery, and
 the degradation measuring unit measures, as the degradation level, a decrease in the discharge capacity during the unit period.

8. The secondary battery management device according to claim 1, wherein
 the use history acquiring unit acquires, as the use history, information indicating driving history of an electric vehicle from the electric vehicle, the electric vehicle using the secondary battery as a driving power source.

9. A secondary battery management program causing a computer to implement:
 a function of acquiring performance information of a secondary battery from an electronic equipment using the secondary battery as a driving power supply;
 a function of measuring a degradation level of performance of the secondary battery during a predetermined unit period;
 a function of acquiring use history from the electronic equipment, the use history being information indicating usage of the electronic equipment used by a user;
 a function of estimating a degradation level of the secondary battery at a predetermined future time point on the basis of the degradation level of the performance of the secondary battery and the use history.

* * * * *